United States Patent
Luiten (12)

(10) Patent No.: US 10,778,825 B2
(45) Date of Patent: Sep. 15, 2020

(54) PROTECTIVE CASE FOR A SMARTPHONE

(71) Applicant: Mconomy B.V., Nieuw-Vennep (NL)

(72) Inventor: Jens Jacobus Andries Luiten, The Hague (NL)

(73) Assignee: Mconomy B.V., Nieuw-Vennep (NL)

( * ) Notice: Subject to any disclaimer, the term of this patent is extended or adjusted under 35 U.S.C. 154(b) by 0 days.

(21) Appl. No.: 16/100,472

(22) Filed: Aug. 10, 2018

(65) Prior Publication Data

US 2020/0053194 A1 Feb. 13, 2020

(51) Int. Cl.
| | |
|---|---|
| *H04M 1/215* | (2006.01) |
| *H05K 5/00* | (2006.01) |
| *B32B 27/40* | (2006.01) |
| *B32B 27/06* | (2006.01) |

(52) U.S. Cl.
CPC ............ *H04M 1/215* (2013.01); *B32B 27/06* (2013.01); *B32B 27/40* (2013.01); *H05K 5/0086* (2013.01); *B32B 2274/00* (2013.01); *H04M 2250/22* (2013.01)

(58) Field of Classification Search
CPC .............................. H04M 1/185; H04M 1/215
See application file for complete search history.

(56) References Cited

U.S. PATENT DOCUMENTS

| | | | |
|---|---|---|---|
| 8,190,222 B2 | 5/2012 | Cheng | |
| 8,909,309 B2 | 12/2014 | LaColla et al. | |
| 9,281,858 B2 | 3/2016 | Fathollahi | |
| 9,526,320 B2 | 12/2016 | Roberts et al. | |
| 2010/0264786 A1* | 10/2010 | Cheng | H04M 1/0202 312/223.1 |
| 2014/0187297 A1* | 7/2014 | Chang | H04M 1/21 455/575.8 |
| 2014/0243054 A1* | 8/2014 | LaColla | H04M 1/04 455/575.8 |
| 2015/0194995 A1* | 7/2015 | Fathollahi | H04B 1/3888 455/575.8 |

* cited by examiner

*Primary Examiner* — Hsinchun Liao
(74) *Attorney, Agent, or Firm* — Harness, Dickey & Pierce, P.L.C.

(57) ABSTRACT

The present invention relates to a protective case for a smartphone. The case has an integral plastic bottom wall and upstanding side wall. The inside of the side wall features an inwardly compressible zigzag structure with inwardly and outwardly extending angles.

14 Claims, 4 Drawing Sheets

PROTECTIVE CASE FOR A SMARTPHONE

FIELD

The present invention relates to a case for a handheld communication device, preferably a mobile phone with a screen, particularly a smartphone, to protect it against damage from falls and other physical shocks.

BACKGROUND

Over the past 20 years smartphones have become omnipresent in modern society. Because of their cost and importance to their users, ways have been sought for protecting smartphones against damage in the event that they are dropped or subjected to severe impacts or other physical shocks. In this regard, protective cases have been developed for covering the sides and rear surfaces of smartphones. See, for example, the two-piece case of U.S. Pat. No. 8,190,222B2, the one-piece case with cushion inserts at the corners of U.S. Pat. No. 8,909,309B2, the one-piece case of three-layers with three different hardnesses of U.S. Pat. No. 9,281,858B2, and the one-piece case of U.S. Pat. No. 9,526,320B2 with a sidewall of a layer of a flexible polymer and a layer of a damping material having a plurality of inwardly and outwardly projecting protrusions.

However, a one-piece case to better protect smartphones against damage from falls and other shocks has continued to be sought.

SUMMARY

This invention relates to a one-piece, generally rectangular case for a mobile electronic device, preferably a mobile phone with a screen, more particularly a smartphone, the case comprising an integral bottom wall and upstanding side wall, each comprising a flexible thermoplastic, wherein the inside of the side wall has an inwardly compressible zigzag structure with inwardly and outwardly extending angles. Advantageously, the angles are each from 60 to 130 degrees, more advantageously obtuse, still more advantageously from 100 to 120 degrees. Also more advantageously, the angles are the same.

An aspect of this invention relates to a one-piece case for a smartphone, the case comprising an integral bottom wall and upstanding side wall, each comprising a layer of a flexible thermoplastic, advantageously a thermoplastic polyurethane (TPU), wherein the inside of the side wall has an inwardly compressible zigzag structure with inwardly and outwardly extending angles. Advantageously, the angles are each from 60 to 130 degrees, more advantageously obtuse, still more advantageously from 100 to 120 degrees. Also more advantageously, the angles are the same.

Another aspect of this invention relates to a one-piece case for a smartphone, the case comprising an integral bottom wall and an upstanding side wall, each wall comprising a first layer of a flexible first thermoplastic, advantageously a thermoplastic polyurethane; the inside of the sidewall further comprising a second layer of a more flexible second thermoplastic, advantageously a thermoplastic elastomer (TPE), the second layer being inwardly of, and covering, the first layer and having an inwardly compressible zigzag structure with inwardly and outwardly extending angles. Advantageously, the angles are each from 60 to 130 degrees, more advantageously obtuse, still more advantageously from 100 to 120 degrees. Also more advantageously, the angles are the same.

Still another aspect of this invention relates to a one-piece case for a smartphone, the case comprising an integral bottom wall and an upstanding side wall, each wall comprising a first layer of a flexible first thermoplastic, advantageously a thermoplastic polyurethane; the inside of the sidewall further comprising a second layer of a more flexible second thermoplastic, advantageously a thermoplastic elastomer, the second layer being inwardly of, and covering, the first layer and having an inwardly compressible zigzag structure with inwardly and outwardly extending angles; and the inside of the side wall further comprising a third layer of a flexible third thermoplastic, advantageously the same as the first thermoplastic, the third layer being inwardly of, and covering, the second layer. Advantageously, the angles are each from 60 to 130 degrees, more advantageously obtuse, still more advantageously from 100 to 120 degrees. Also more advantageously, the angles are the same.

This invention also relates to a one-piece case for a smartphone, the case comprising an integral bottom wall and an upstanding side wall, each wall comprising a flexible thermoplastic, wherein the outside surface of the side wall comprises a multi-faceted or diamond-like structure protruding outwardly from each corner of the case. Advantageously, the inside of the side wall has an inwardly compressible zigzag structure with inwardly and outwardly extending angles. Advantageously, the angles are each from 60 to 130 degrees, more advantageously obtuse, still more advantageously degrees. Also more advantageously, the angles are the same.

DETAILED DESCRIPTION

Figure 1:
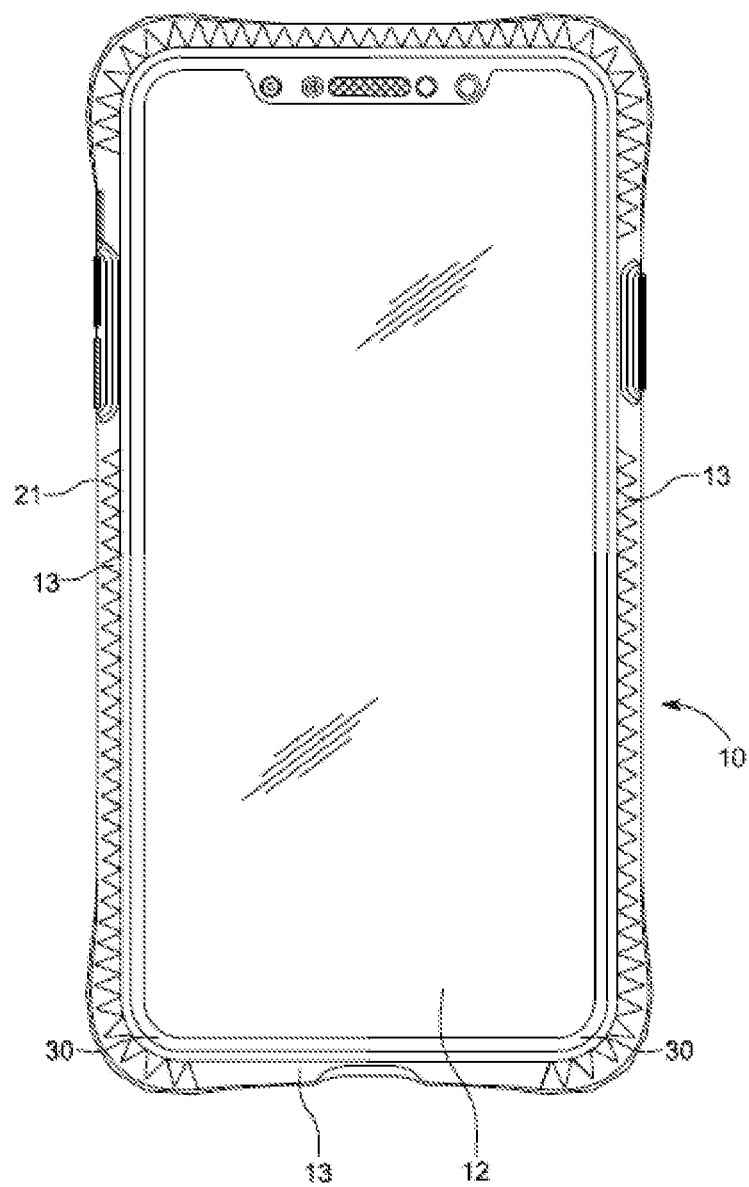
FIG. 1 shows a top view of a one-piece case of this invention, in which has been inserted a smartphone. The inside of the side wall of the case has an inwardly compressible zigzag structure with inwardly and outwardly extending peaks.
Figure 2:
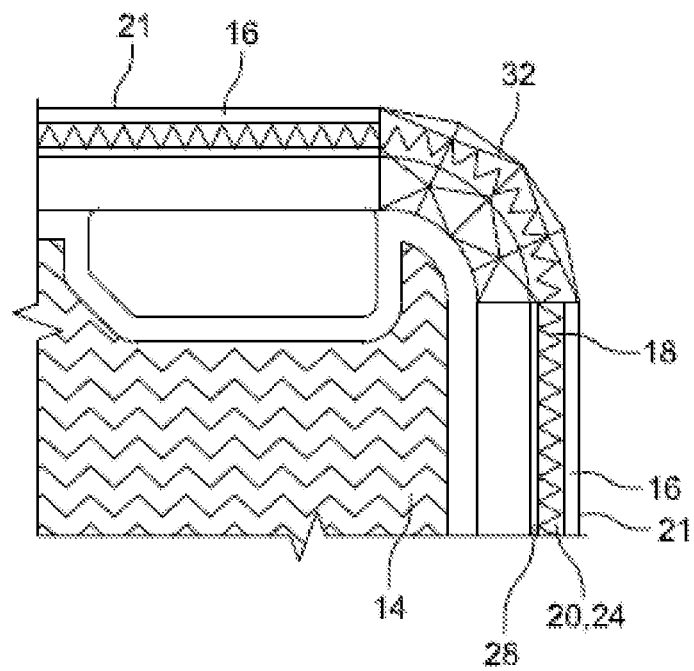
FIG. 2 schematically shows a top view of a corner of a one-piece case of the invention (without a smartphone), having an integral bottom wall and an upstanding side wall, each wall having a first layer of a flexible first thermoplastic, the inside of the sidewall further having a second layer of a more flexible second thermoplastic forming an inwardly compressible zigzag structure and the inside of the sidewall further having a third layer of a flexible third thermoplastic, covering, the second layer.
Figure 3:
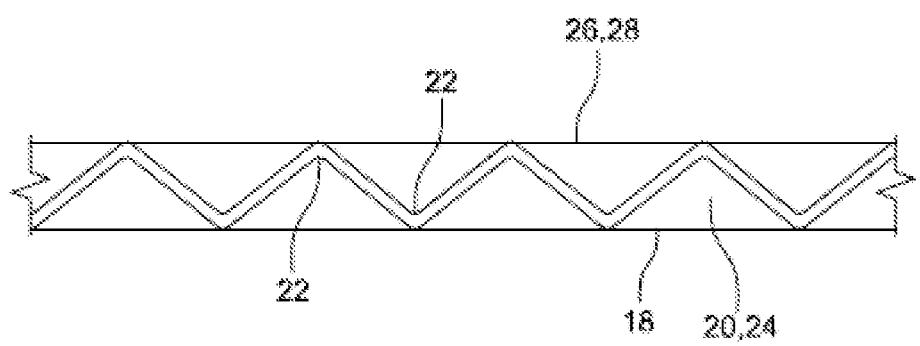
FIG. 3 schematically shows a detailed top view of the inside of the side wall of the one-piece case of FIG. 2, with the inwardly compressible zigzag structure of its second layer with inwardly and outwardly extending peaks.
Figure 4:
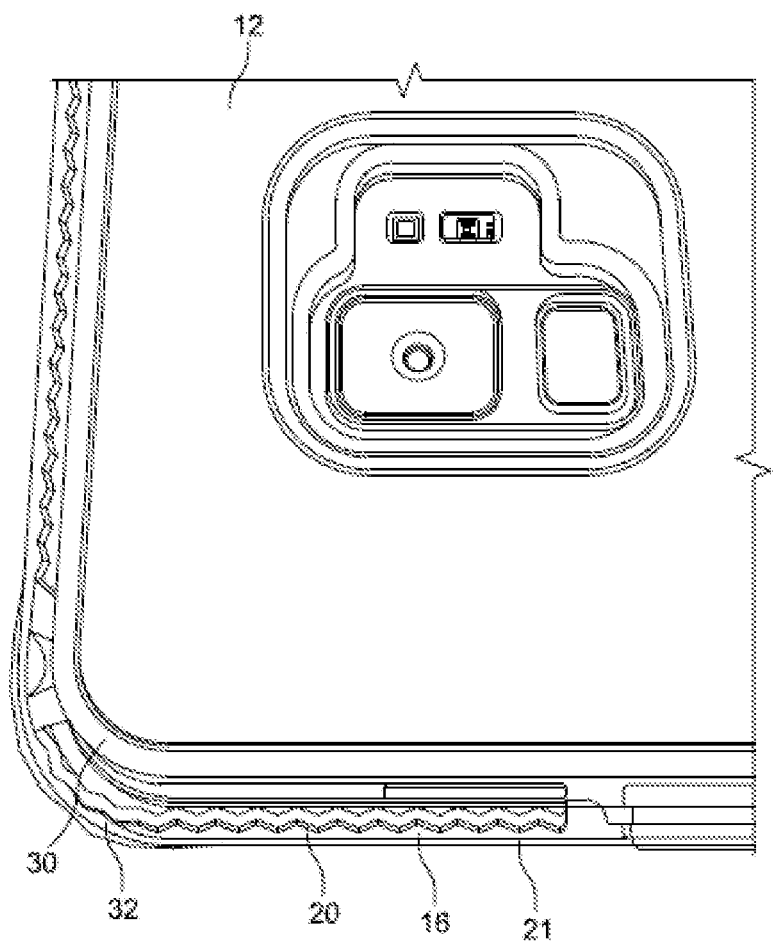
FIG. 4 shows a top view of a corner of the one-piece case of FIG. 2 (in which has been inserted a smartphone).
Figure 5:
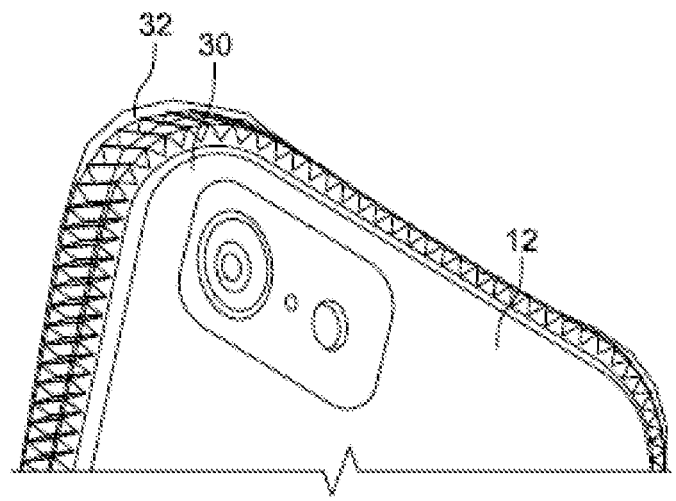
FIG. 5 shows a top view of a corner of the one-piece case of FIG. 2 (in which has been inserted a smartphone).
Figure 6:
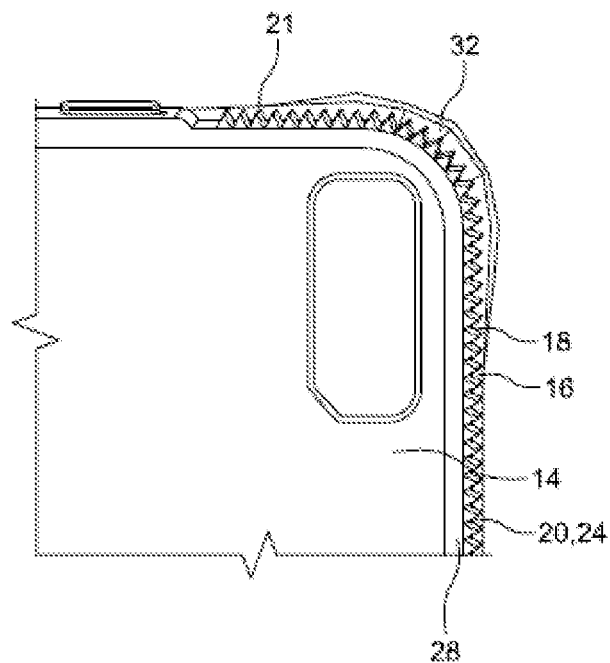
FIG. 6 shows a top view of a corner of the one-piece case of FIG. 2 (without a smartphone).

Embodiments of the present invention will now be described, by way of example only, with reference to the accompanying drawings. Shown in FIGS. 1 to 6 is a one-piece, generally rectangular case 10 of this invention for a smartphone 12 which can protect the sides 13 of the smartphone against damage from falls and other physical shocks. The case 10 has an integral bottom wall 14 and an upstanding side wall 16. The side wall 16 preferably extends around substantially all of the periphery of the bottom wall 14. Each wall 14, 16 is made of a flexible thermoplastic. The inside surface 18 of the side wall 16 has a zigzag structure 20 which can be compressed inwardly by a pressure, force, impact or shock exerted on the outside surface 21 of the side wall 16 (e.g., by dropping the smartphone 12 and case 10). The zigzag structure 20, when being compressed inwardly, serves to absorb the pressure, force, impact or shock on the outside surface 21 of the side wall 16. The zigzag structure 20 features a plurality of alternating inwardly and outwardly extending angles 22. Preferably, the angles 22 are each from 60 to 130 degrees, more particularly obtuse, still more particularly 100-120 degrees. Also more particularly, the angles 22 are the same.

In one embodiment of the one-piece case 10 of this invention, the integral bottom wall 14 and upstanding side wall 16 are each made of the same flexible first thermoplastic, preferably a thermoplastic polyurethane (TPU). The inside surface 18 of the side wall 16 is formed with the inwardly compressible zigzag structure 20 of inwardly and outwardly extending angles 22. Preferably, the angles 22 are each from 60 to 130 degrees, more particularly obtuse, still more particularly from 100 to 120 degrees. Also more particularly, the angles 22 are the same.

In another embodiment of the one-piece case 10 of this invention, the integral bottom wall 14 and upstanding side wall 16 are each made of the same flexible first thermoplastic, preferably a thermoplastic polyurethane. Adhered to, and covering, the inside surface 18 of the sidewall 16 is a second layer 24 of a more flexible second thermoplastic, preferably a thermoplastic elastomer (TPE). The second layer has the inwardly compressible zigzag structure 20 with inwardly and outwardly extending angles 22. Preferably, the angles 22 are each from 60 to 130 degrees, more particularly obtuse, still more particularly from 100 to 120 degrees. Also more particularly, the angles 22 are the same.

In yet another embodiment of the one-piece case 10 of this invention, the integral bottom wall 14 and upstanding side wall 16 are each made of the same flexible first thermoplastic, advantageously a thermoplastic polyurethane. Adhered to, and covering, the inside surface 18 of the sidewall 16 is a second layer 24 of a more flexible second thermoplastic, preferably a thermoplastic elastomer. The second layer 24 has the inwardly compressible zigzag structure 20 of inwardly and outwardly extending angles 22. Adhered to, and covering, the inside surface 26 of the second layer 24 on the inside surface 18 of the side wall 16 is a third layer 28 of a flexible third thermoplastic, preferably the same as the flexible first thermoplastic. Preferably, the angles 22 are each from 60 to 130 degrees, more particularly obtuse, still more particularly from 100 to 120 degrees. Also more particularly, the angles 22 are the same.

Also shown in FIGS. 1 to 6 is a one-piece case 10 of this invention for a smartphone 12 which can protect the corners 30 of the smartphone against damage from falls and other physical shocks. The case 10 has an integral bottom wall 14 and an upstanding side wall 16, preferably extending around substantially all of the periphery of the bottom wall 14. Preferably, the case 10 is one of the aforementioned embodiments of the invention to protect the sides 13 of the smartphone 12 against damage from falls and other physical shocks. In this regard, the inside surface 18 of the side wall 16 has the inwardly compressible zigzag structure 20 with inwardly and outwardly extending angles 22. Each wall 14, 16 is made of one or more flexible thermoplastics. The outside surface 21 of the side wall 16 features a raised, multi-faceted or diamond-like structure 32 at each corner 34 of the case 10. The raised, multi-faceted structure 32 serves to protect the corners 30 of the smartphone against a force, impact or shock exerted on one of the corners 34 of the sidewall 16 of the case 10 (e.g., by dropping the smartphone 12 and case 10). The diamond-like structure 32 of the corners 34, since it is asymmetrical, also prevents the case 10 and the smartphone 12 therein from bouncing upwardly in the event they fall. Instead, the case and phone tend to bounce sideways so that their falling movement comes to a relatively quick stop.

The multi-faceted structure forms a dissipative structure, comprising a cell structure disposed at the outside of each corner of the case, the cell structure comprising a plurality of interconnected polyhedrons, each of the plurality of interconnected polyhedrons being formed by a plurality of ridges protruding from the surface and having a plurality of depressions formed between the ridges, wherein the depressions of each of the first plurality of interconnected polyhedrons is configured to at least partially transfer forces resulting from an impact in response to a further polyhedron. In this regard, it is believed that the multi-faceted structure 32 deflects and thereby softens the force, impact or shock on the outside surface 21 of the side wall 16 at the corners 34 of the case 10.

In yet another embodiment of the one-piece case 10 of this invention, the case preferably comprises a pivotable front cover for protection of the touch-sensitive screen when in closed position, the front cover being disposed such that it comprises a flexure bearing at a side of the case, and a portion engaging with the one-piece case for fixture.

The present invention also relates a process for the protection of a mobile electronic device, comprising providing a case according to the invention that is configured to removably enclose the corners, sides and at least one back of front surface of the mobile device, and positioning the mobile device in the case, wherein preferably the mobile electronic device is a smartphone.

The present invention also preferably relates to the use of the case according to the invention for the impact protection of a mobile electronic device, preferably a smartphone.

The following Examples serve to illustrate the invention, and should not be construed as limiting the scope of the present invention.

EXAMPLE

Impact Test

Different commercially available smartphone cases and a smart phone case according to the invention were subjected to an impact resistance test. To this matter, a wooden multiplex board was cut and shaped to the size and shape of a smartphone to form smart phone simulators, and provided with a sensor capable of sensing the acceleration and vibration of the smart phone simulator.

The smart phone simulators were then placed into the smart phone cases, and affixed so that the simulator could not move. Then the case-clad simulator was subjected repeatedly to an impact of defined force with a hammer at one of the corners of the smart phone case, and the resultant vibrations were measured. Each case was tested at least 10 times, and the average detected vibrations were examined. To convert the clear differences into a comparative figure, the surfaces of the shockwave were calculated, and converted into a relative figure, whereby the higher the figure, the better the protection afforded by the case.

Example 1

A case for a smartphone with three-layer side walls that have been injection-molded with inner and outer TPU layers and a middle TPE layer with a zigzag structure and with corners having diamond shaped polygon patterns.

Example 2

A case for a smartphone with side walls that have been injection molded with a single TPU layer having an inner surface with a zigzag structure and with corners having diamond shaped polygon patterns.

Comparative Example 1

A commercially available single layer TPU case for a smartphone with essentially uniform thickness, and not incorporating any additional architectural features.

Comparative Example 2

A commercially available Polycarbonate case for a smartphone with TPU mold-injected parts.

Comparative Example 3

A commercially available TPU case for a smartphone with a triple layer honeycomb TPU material.

Table 1 shows the measured results, as well as the average and standard deviation.

TABLE 1

| Case tested | Comp. 1 | Comp. 2 | Comp. 3 | Ex. 1 | Ex. 2 |
|---|---|---|---|---|---|
| Measured and calculated value | 4.5 | 3.0 | 7.0 | 11.4 | 8.7 |
| | 4.1 | 4.0 | 5.5 | 8.9 | 10.2 |
| | 4.2 | 3.5 | 5.3 | 10.9 | 9.9 |
| | 4.2 | 3.6 | 5.8 | 10.4 | 10.2 |
| | 4.7 | 4.2 | 5.7 | 11.7 | 9.8 |
| | 4.5 | 4.0 | 5.7 | 10.5 | 9.1 |
| | 4.6 | 4.1 | 6.1 | 8.5 | 7.4 |
| | 4.0 | 4.6 | 5.8 | 11.2 | 7.2 |
| Average | 4.4 | 3.9 | 5.9 | 10.4 | 9.1 |
| St. dev. (p) | 0.3 | 0.5 | 0.5 | 1.1 | 1.1 |

The above test indicated that the smart phone cases according to the present invention exhibited a much higher stability in dampening and reducing the impact of the forces and impact exerted onto the smart phone, as compared to commercially available phone cases.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A one-piece case for a mobile electronic device, the case comprising:
    an integral bottom wall and upstanding side wall, each wall comprising a flexible thermoplastic,
    wherein the inside of the side wall has an inwardly compressible zigzag structure with inwardly and outwardly extending angles, and
    wherein the side wall comprises an outer layer of the flexible thermoplastic and an inner layer of the flexible thermoplastic adhered respectively to the outside and inside surfaces of the zigzag structure.

2. The one-piece case of claim 1, wherein the mobile electronic device is a smartphone comprising a touch-sensitive screen.

3. The one-piece case of claim 2, further comprising a pivotable front cover for protection of the touch-sensitive screen when in closed position, the front cover being disposed such that it comprises a flexure bearing at a side of the case, and a portion engaging with the one-piece case for fixture.

4. The one-piece case of claim 1, wherein the angles are each from 60 to 130 degrees.

5. The one-piece case of claim 1, wherein the angles are each from 100 to 120 degrees.

6. The one-piece case of claim 1, wherein the angles are the same.

7. The one-piece case of claim 1, wherein the bottom and side walls each comprise a first layer of a thermoplastic polyurethane (TPU).

8. The one-piece case of claim 1, wherein the bottom and side walls each comprise a first layer of a thermoplastic polyurethane (TPU) and the inside of the side wall further comprises a second layer of a more flexible second thermoplastic, the second layer being inwardly of, and covering, the first layer.

9. The one-piece case of claim 8, wherein the second layer is of thermoplastic elastomer (TPE).

10. A process for the protection of a mobile electronic device, comprising:
    providing a case according to claim 1 that is configured to removably enclose the corners, sides and at least one back of front surface of the mobile device, and
    positioning the mobile device in the case.

11. The process according to claim 10, wherein the mobile electronic device is a smartphone.

12. The one-piece case of claim 1, wherein the side wall has been injection molded with the inner and outer layers and the zigzag structure.

13. A one-piece case for a smartphone, the case comprising:
    an integral bottom wall and upstanding side wall, each wall comprising a flexible thermoplastic,
    wherein the outside surface of the side wall comprises a multi-faceted structure protruding outwardly from each corner of the case,
    wherein the multi-faceted structure comprises a cell structure comprises a plurality of interconnected polyhedrons and forms a dissipatie structure; each of the plurality of interconnected polyhedrons being formed by a plurality of ridges protruding from the surface and having a plurality of depressions formed between the ridges, and
    wherein the depressions of each of the first plurality of interconnected polyhedrons is configured to at least partially transfer forces resulting from an impact in response to a further polyhedron.

14. The one-piece case of claim 13, wherein the inside of the side wall has an inwardly compressible zigzag structure of claim 1.

* * * * *